(12) United States Patent
Muffoletto et al.

(10) Patent No.: US 6,599,580 B2
(45) Date of Patent: *Jul. 29, 2003

(54) METHOD FOR IMPROVING ELECTRICAL CONDUCTIVITY OF A METAL OXIDE LAYER ON A SUBSTRATE UTILIZING HIGH ENERGY BEAM MIXING

(75) Inventors: Barry C. Muffoletto, Alden, NY (US); Ashish Shah, East Amherst, NY (US); Donald H. Stephenson, Plainfield, IN (US)

(73) Assignee: Wilson Greatbatch Ltd., Clarence, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 217 days.

(21) Appl. No.: 08/847,946

(22) Filed: May 1, 1997

(65) Prior Publication Data

US 2001/0051231 A1 Dec. 13, 2001

(51) Int. Cl.$^7$ .................................................. B05D 3/00
(52) U.S. Cl. ....................... 427/454; 427/455; 427/456; 427/533; 427/554; 427/531; 427/585; 427/250
(58) Field of Search ................................. 427/533, 554, 427/455, 456, 454, 531, 585, 250

(56) References Cited

U.S. PATENT DOCUMENTS 4,477,316 A * 10/1984 Sakai et al. ................. 204/290
4,495,255 A * 1/1985 Draper et al. ......... 219/121 LM

* cited by examiner

Primary Examiner—Katherine A. Bareford
(74) Attorney, Agent, or Firm—Hodgson Russ LLP

(57) ABSTRACT

A method for improving the electrical conductivity of a substrate of metal, metal alloy or metal oxide comprising depositing a small or minor amount of metal or metals from Group VIIIA metals (Fe, Ru, Os, Co, Rh, Ir, Ni, Pd, Pt) or from Group IA metals (Cu, Ag, Au) on a substrate of metal, metal alloys and/or metal oxide from Group IVA metals (Ti, Zr, Hf), Group VA metals (V, Nb, Ta), Group VIA metals (Cr, Mo, W) and Al, Mn, Ni and Cu and then directing a high energy beam onto the substrate to cause an intermixing of the deposited material with the native oxide of the substrate metal or metal alloy. The native oxide layer is changed from electrically insulating to electrically conductive. The step of depositing can be carried out, for example, by ion beam assisted deposition, electron beam deposition, chemical vapor deposition, physical vapor deposition, plasma assisted, low pressure plasma and plasma spray deposition and the like. The high energy beam can be an ion beam from a high energy ion source or it can be a laser beam. The deposition may be performed on either treated or untreated substrate. The substrate with native oxide layer made electrically conductive is useable in the manufacture of electrodes for devices such as capacitors and batteries.

12 Claims, 4 Drawing Sheets

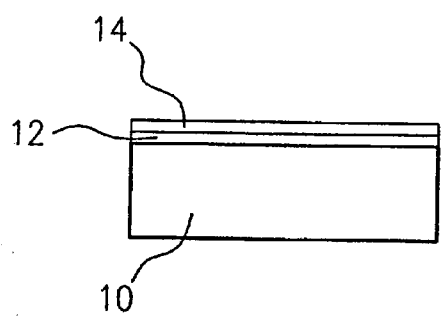
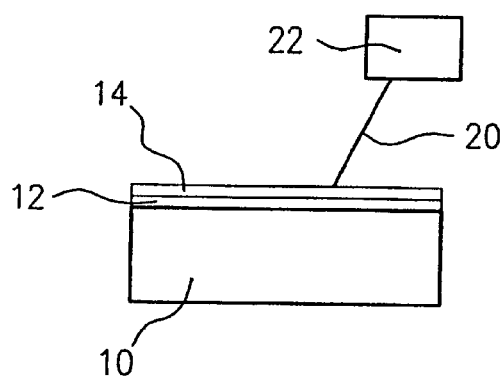
FIG. 1          FIG. 2
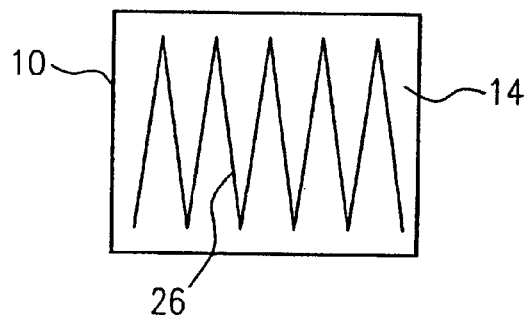
FIG. 3
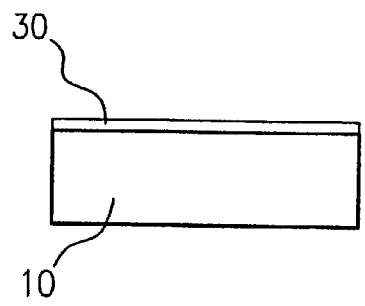
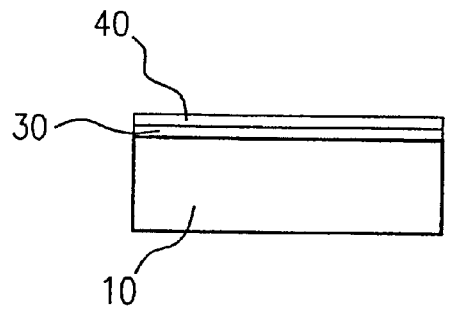
FIG. 4          FIG. 5

METHOD FOR IMPROVING ELECTRICAL CONDUCTIVITY OF A METAL OXIDE LAYER ON A SUBSTRATE UTILIZING HIGH ENERGY BEAM MIXING

BACKGROUND OF THE INVENTION

This invention relates to the art of treating metals, metal alloys and metal oxides, and more particularly to a new and improved method for enhancing the electrical conductivity of metals, metal alloys and metal oxides.

One area of use of the present invention is in the manufacturing of electrodes for capacitors, batteries and the like, although the principles of the present invention can be variously applied. Metals and metal alloys have a native oxide present on the surface. This is an insulating layer and hence if the material is to be used as a substrate for an electrode, the oxide has to be removed or made electrically conductive.

If the oxide is removed by chemical treatment, such as by etching with an acid or electrolytic etching to expose the underlying metal, special steps must be taken in order to complete the electrical contacts before the native oxide can be regenerated and interfere with the electrical contacts. Such measures require special apparatus and extremely careful handling of the materials, all of which adds cost to the fabricating of electrical devices incorporating these materials to which electrical contact must be made. Another approach involves removing the oxide layer and plating the bare substrate metal with an expensive noble metal, such as silver, gold, or alloys of silver, gold and platinum, or the formation of an electrically conducting compound on the bare substrate surface. The materials employed are expensive and the steps required to plate the substrate are costly and time consuming. In addition, the metal plating or electrically conducting compound must be disposed on the substrate as a continuous film for maximum performance. Therefore, the plating or compound formation typically is carried out after the substrate metal is formed into its final shape for the electrical device in which it is incorporated in order to avoid damage to the coating. This, in turn, adds to the cost and complexity of the manufacturing process.

U.S. Pat. No. 5,098,485 issued Mar. 24, 1992 to David A. Evans proposes a solution to the oxide problem by altering the native oxide from an electrically insulating to an electrically conducting condition without removal of the native oxide layer to expose the underlying metal or alloy. A solution containing ions of an electrical material is applied to the native oxide layer, and then the substrate, oxide and applied ions are heated to an elevated temperature for a time sufficient to incorporate the ions into the oxide layer to change it from an electrical insulator to an electrical conductor.

SUMMARY OF THE INVENTION

It would therefore, be highly desirable to provide a new and improved method for enhancing the electrical conductivity of metals, metal alloys and metal oxides which does not require additional heat treatment, which provides control over the density and depth of the material introduced to the treated surface, which can be performed in a manner preventing substrate degradation and deformation, and which improves the quality of the treated surface.

The present invention provides a method for improving the electrical conductivity of a substrate of metal, metal alloy or metal oxide comprising depositing a small or minor amount of metal or metals from Group VIIIA metals (Fe, Ru, Os, Co, Rh, Ir, Ni, Pd, Pt) or from Group IA metals (Cu, Ag, Au) on a substrate of metal, metal alloys and/or metal oxide from Group IVA metals (Ti, Zr, Hf), Group VA metals (V, Nb, Ta), Group VIA metals (Cr, Mo, W) and Al, Mn, Ni and Cu and then directing a high energy beam onto the substrate to cause an intermixing of the deposited material with the native oxide of the substrate metal or metal alloy. The native oxide layer is changed from electrically insulating to electrically conductive. The step of depositing can be carried out, for example, by ion beam assisted deposition, electron beam deposition, chemical vapor deposition, physical vapor deposition, plasma assisted, low pressure plasma and plasma spray deposition and the like. The high energy beam can be an ion beam from a high energy ion source or it can be a laser beam. The deposition may be performed on either treated or untreated substrate.

The method of the present invention advantageously does not require additional heat treatment and provides control over the density and depth of the material mixed into the treated surface thereby not affecting the bulk of the material. The method can be performed at a temperature sufficiently low so as to prevent substrate degradation and deformation. It is believed that the quality of the treated surface is improved by the method of the present invention. Another advantage is that using a substrate treated by the method of the present invention will allow the surface thereof to be treated to passivate it from chemical reaction while still providing adequate electrical conductivity. Stainless steels having native insulating oxide layers also can be treated by the method of the present invention to provide an electrically conductive oxide layer.

A substrate treated by the method of the present invention is ready for further processing in the manufacture of an electrode for use in capacitors, batteries and the like. Typically, in the case of a capacitor, an appropriate electrode material is deposited on the substrate treated surface by techniques well-known to those skilled in the art. Examples of electrode materials are redox pseudo capacitance materials such as, but not limited to, oxides and mixed oxides of ruthenium, iridium, manganese, nickel, cobalt, tungsten, niobium, iron, molybdenum, double layer materials or under potential deposition systems such as palladium, platinum, lead dioxide or electro-active conducting polymers such as polyaniline, polypyrole and polythiophene.

The foregoing and additional advantages and characterizing features of the present invention will become clearly apparent upon a reading of the ensuing detailed description together with the included drawing wherein:

BRIEF DESCRIPTION OF THE DRAWINGS FIGURES

FIG. 1 is a diagrammatic view illustrating the method of the present invention at one stage thereof;

FIG. 2 is a diagrammatic view illustrating the method of the present invention at another stage thereof;

FIG. 3 is a diagrammatic view illustrating another aspect of the method of the present invention;

FIG. 4 is a diagrammatic view of a substrate after treatment by the method of the present invention;

FIG. 5 is a diagrammatic view of the substrate of FIG. 4 having electrode material deposited thereon for use in manufacture of a capacitor electrode.

DETAILED DESCRIPTION OF THE ILLUSTRATED EMBODIMENT

Figure 6:
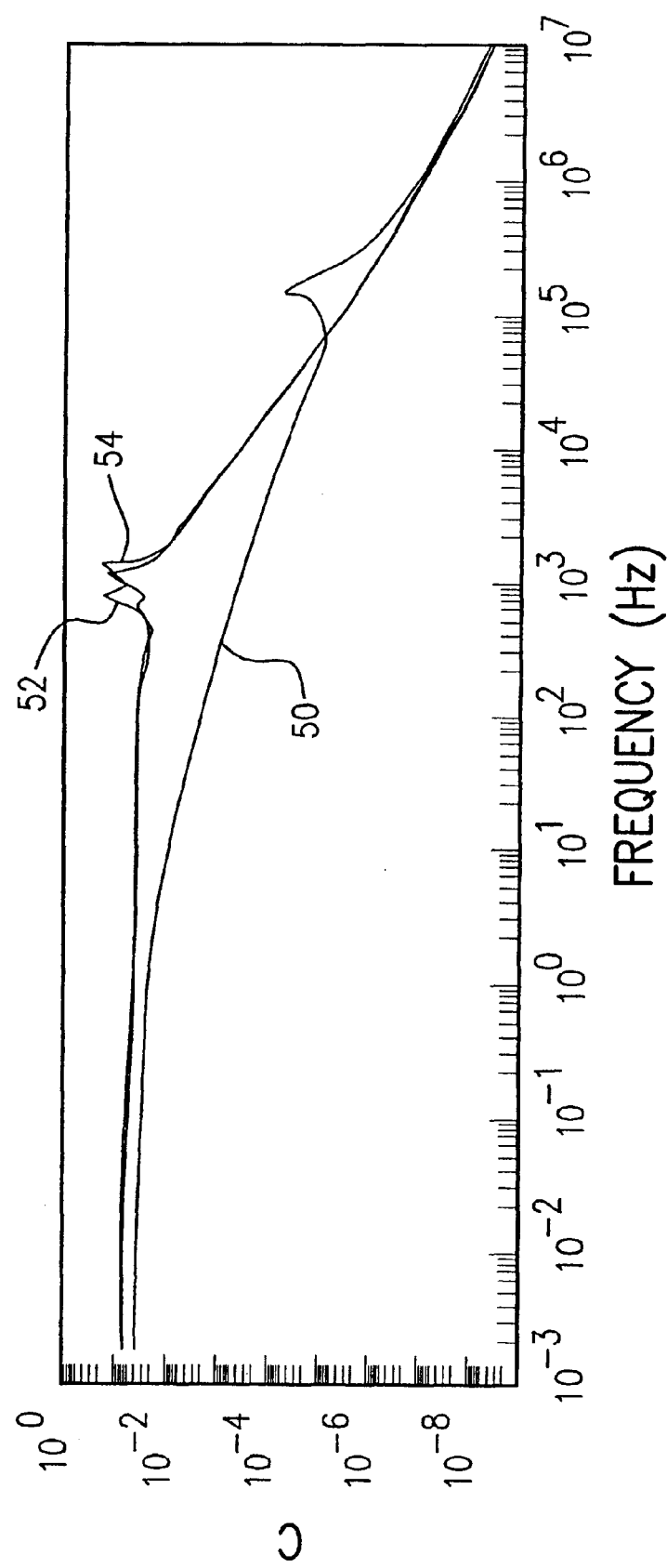
FIGS. 6, 7 and 8 are graphs depicting impedance spectroscopy scans on substrates of the type shown in FIG. 5.

Metals and metal alloys have a native oxide present on the surface which is electrically insulating and must be removed or made electrically conductive if the metal or metal alloy is to be used as an electrode in devices such as capacitors and batteries. Referring to FIG. 1 there is shown a substrate 10 having an electrically insulating native oxide layer 12 or a surface thereof. In accordance with the present invention, oxide layer 12 is made more electrically conductive, i.e. changed from electrically insulating to electrically conductive. Substrates treated by the method of the present invention include metals and alloys thereof selected from the group consisting of Group IVA metals (Ti, Zr, Hf), Group VA metals (V, Nb, Ta), Group VIA metals (Cr, Mo, W), aluminum, manganese, nickel, copper and stainless steel. They typically have a thickness in the range from about 0.001 mm. to about 2.0 mm.

In accordance with the present invention, a layer 14 is deposited on the native oxide layer 12 wherein the layer 14 is a small amount of metal or metals selected from the group consisting of Group IA metals (Cu, Ag, Au) and Group VIIIA metals (Fe, Ru, Os, Co, Rh, Ir, Ni, Pd, Pt). The layer 14 is deposited by a deposition process which may be a standard industrial process, for example, ion beam assisted deposition, chemical vapor deposition, physical vapor deposition, plasma assisted deposition, low pressure plasma deposition and plasma spray deposition, all of which processes are well-known to those skilled in the art.

Following the deposition process, the next step in the method of the present invention is directing a high energy beam 20 from a source 22 as shown in FIG. 2 onto the deposited metal 14 and the native oxide layer 12 to intermix the deposited metal with the native surface oxide of the substrate metal or metal alloy. The high energy beam 20 can be an ion beam in which case source 22 is a commercially available high energy ion source, or beam 20 can be a laser beam from a commercially available laser 22. The high energy beam 20 is directed along the deposited metal 14 and native oxide layer 12 in a raster-like pattern represented diagrammatically by path 26 shown in FIG. 3.

The ion beam which carries out the mixing includes Ar, Xe, Kr, etc. ions. Other high energy sources of the ion beam may include linear accelerators, cyclotrons and synchrotrons. One major advantage of ion beam mixing is the precise control of mixing concentration (density) and depth it provides. Since the ion beam current can be measured accurately during bombardment, a tight control over ion energies is obtained. This determines how accurately and to what depth the ions can be mixed. Very shallow and well defined mixed layers can be achieved. By controlling the amount of material deposited and varying the amount of ion energy the density can also be changed. Another major advantage is that the mixing can be done at relatively low temperatures, usually less than 100° C. This will prevent the material into which the mixing is taking place from deforming or changing from its pre-treatment state.

The intermixing of the deposited metal 14 and the native oxide layer 12 by means of the high energy beam 20 converts the electrically insulating native oxide layer 12 to a mixed layer 30 on substrate 10 as shown in FIG. 4 which mixed layer 30 has a degree of electrical conductivity sufficient to make substrate 10 useable as an electrode in a device such as a capacitor or battery. In other words, native oxide layer 12 has been converted from being essentially non-conductive, i.e. insulating, to having an increased and improved degree of electrical conductivity. Thus, the quality of the treated surface of substrate 10 is improved in that the surface layer 12 is changed from an insulating, semiconducting or dielectric state to an electrically conducting state.

The substrate shown in FIG. 4, treated by the method of the present invention, is ready for further processing in the manufacture of an electrode for use in capacitors, batteries and the like. Typically, in the case of a capacitor, an appropriate electrode material 40 as shown in FIG. 5 is deposited on the substrate treated surface by techniques well-known to those skilled in the art. Examples of electrode material 40 are redox pseudo capacitance materials such as, but not limited to, oxides and mixed oxides of ruthenium, iridium, manganese, nickel, cobalt, tungsten, niobium, iron, molybdenum, or under potential deposition systems such as palladium, platinum, lead dioxide or electro-active conducting polymers such as polyaniline, polypyrole, and polythiophene.

The present invention is illustrated further by the following examples.

EXAMPLE I

A tantalum or titanium substrate similar to substrate 10 shown in FIG. 1 is first abraded on one side using a 3M Scotch-brite pad of very fine type. This produces a rough surface on the side to be coated. It is then degreased and cleaned. This is accomplished by cleaning the foil in an ultrasonic bath using acetone as a solvent for 10 minutes. Next it is washed in an ultrasonic methanol bath and then blow dried using dry, clean compressed air.

The substrate is now ready to be coated with palladium. The substrate is loaded into an ion beam mixing system. Under high vacuum conditions a thin layer of palladium is deposited. The layer of palladium on the surface is about 50–1000 angstroms thick. Then an energetic ion beam of Ar ions with an energy level of about 200 keV bombards the deposited surface causing the palladium to be mixed with the substrate. Sequential deposition and mixing is carried out until a mixing depth of about 400 angstroms is obtained. The palladium mixed depth is about 0.04 to 0.06 $\mu$. The layer of palladium left on the surface is about 20 angstroms thick. On completion the surface is ready to be coated with ruthenium oxide for use in making a capacitor electrode.

EXAMPLE II

A tantalum or titanium substrate similar to substrate 10 shown in FIG. 1 is first abraded on one side using a 3M Scotch-brite pad of very fine type. This produces a rough surface on the side to be coated. It is then degreased and cleaned. This is accomplished by cleaning the foil in an ultrasonic bath using acetone as a solvent for 10 minutes. Next it is washed in an ultrasonic methanol bath and then blow dried using dry, clean compressed air.

The substrate then is coated with palladium in a manner identical to that of Example I. Alternatively, the palladium can be deposited in a sputtering system or any such vapor depositing system.

The coated substrate is then taken to a YAG laser system of the type commercially available from AB Laser Inc. This system consists of a microprocessor controlled rotating mirror galvanometer which deflects a laser beam in the x and y directions. The laser energy causes the surface layer of palladium to mix with the tantalum/tantalum oxide or titanium/titanium oxide layer. This provides good electrical contact with the bulk tantalum or titanium. A combination of a pulse rate of 80 and a darkness factor of 10000 is used to obtain the correct beam energy to mix the palladium with the substrate. The beam is rastered line by line till the specified area has been covered. On completion, the surface is ready to be coated with ruthenium oxide for use in making a capacitor electrode.

Figure 7:
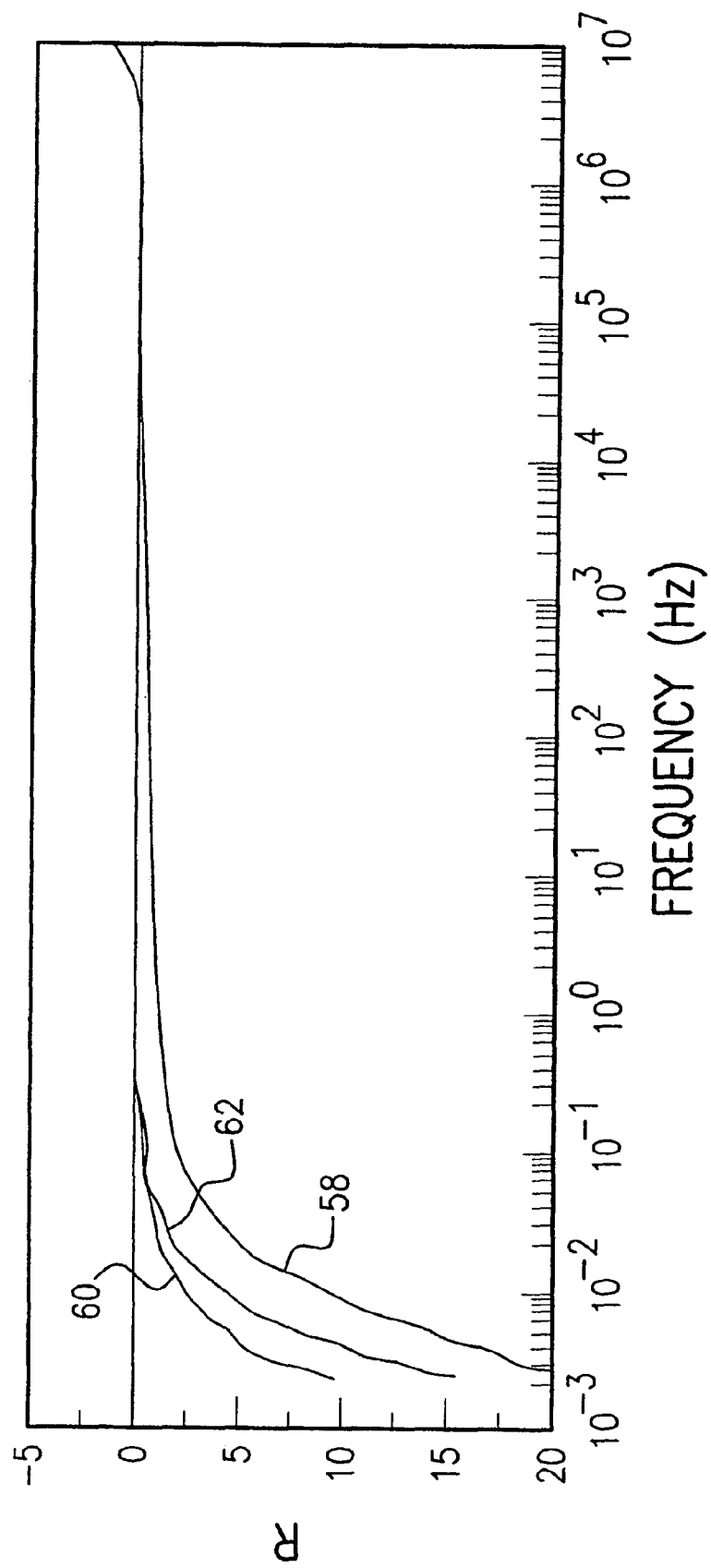
Figure 8:
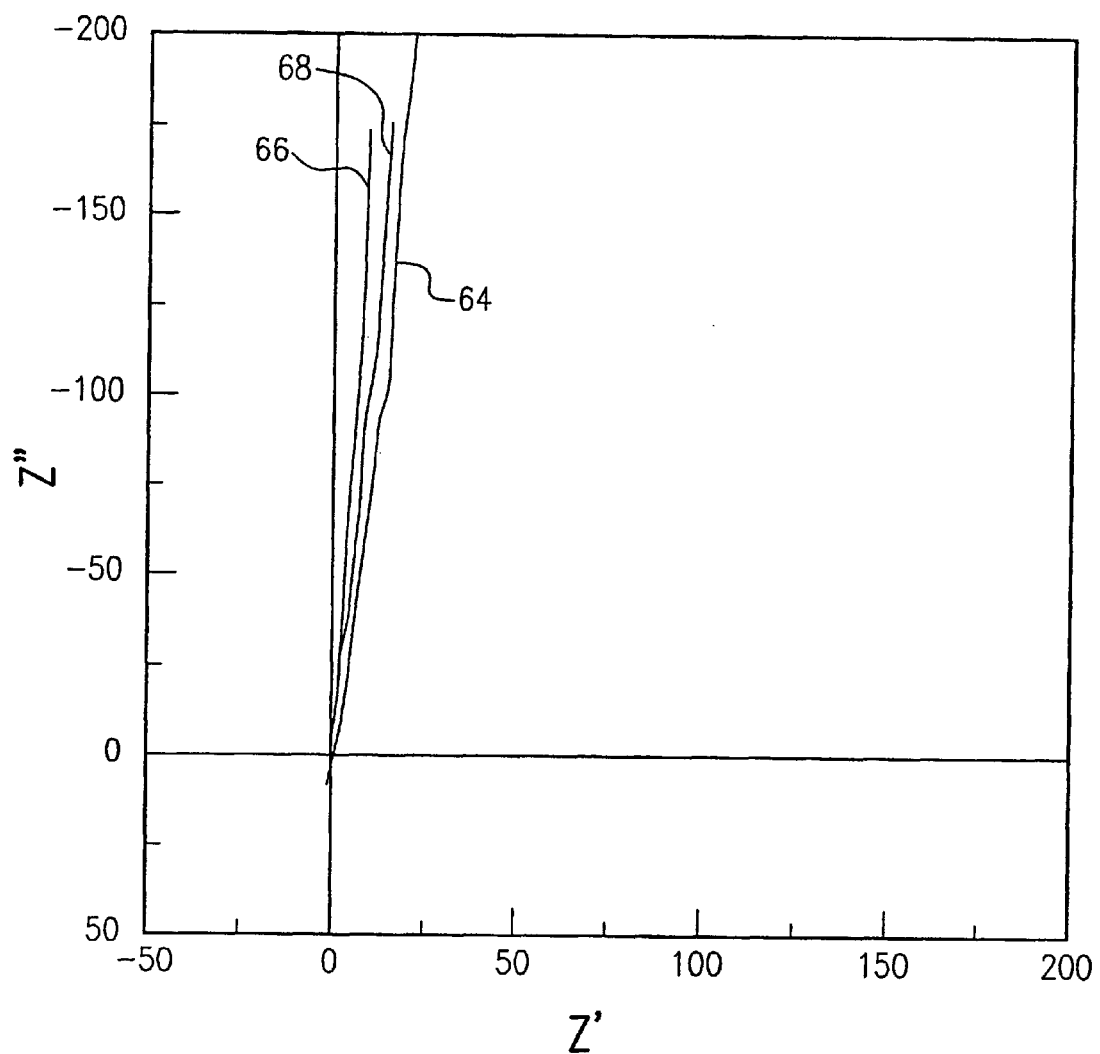

FIGS. 6–8 depict impedance spectroscopy scans on substrates treated according to the present invention and coated with ruthenium oxide for use as capacitor electrodes. FIG. 6 compares the capacitance of the ruthenium oxide coating on bare tantalum to capacitance of the ruthenium oxide coating on tantalum treated according to the present invention. Curve 50 in FIG. 6 is for bare or unprocessed tantalum, and curves 52 and 54 are for tantalum treated according to the present invention wherein intermixing is by means of ion beam and laser beam, respectively. The relatively lower capacitance of the untreated tantalum is due to the presence of the insulating native oxide.

FIG. 7 compares the resistance of the ruthenium oxide coating on bare tantalum to resistance of the ruthenium oxide coating on tantalum treated according to the present invention. Curve 58 in FIG. 7 is for bare or untreated tantalum, and curves 60 and 62 are for tantalum processed according to the present invention wherein mixing is by means of ion beam and laser beam, respectively. The relatively higher resistance of the untreated tantalum at the lower end of the frequency spectrum is due to the presence of the insulating native oxide.

FIG. 8 shows the coating behavior with unprocessed tantalum in curve 64, and processed tantalum where mixing is by way of ion beam and laser beam in curves 66 and 68, respectively. The curves of FIG. 8 also have been obtained by performing impedance spectroscopy scans of the electrodes. They show the same results as the curves of FIGS. 6 and 7 but from a different perspective. They show the relative ideal behavior of the electrodes when used as capacitors. An ideal capacitor would have no resistance and the spectroscopy scan would have been a vertical line, perpendicular to the horizontal. Hence, the closer the scan is to the vertical, the more ideal is the capacitor, or in this case the electrode. The scan for ruthenium oxide coating on unprocessed tantalum, shown by curve 64 in FIG. 8, is the farthest away from the vertical and, thus, is less ideal than the scan for the coatings on processed tantalum.

Table I presents additional capacitance and resistance data from FIGS. 6 and 7 comparing untreated tantalum with a ruthenium oxide coating to ruthenium oxide coated tantalum treated according to the present invention where mixing is done by laser beam and by ion beam.

TABLE I

| Tantalum Material | Cs | Rs |
|---|---|---|
| Bare Tantalum coated with Ru Oxide | 22.30 mF/sq in | 521.26 m ohm |
| Tantalum-Ion Beam process coated with Ru Oxide | 439.56 mF/sq in | 22.57 m ohm |
| Tantalum-Laser processed coated with Ru Oxide | 401.62 mF/sq in | 30.03 m ohm |

The capacitance and resistance values were measured at a frequency of 120 Hz, the standard frequency used in the industry. The values presented in Table I quantify the results shown in FIGS. 6 and 7.

It is therefore apparent that the present invention accomplishes its intended objects. While embodiments of the present invention have been described in detail, that is for the purpose of illustration, not limitation.

What is claimed is:

1. A method of improving electrical conductivity of metals, metal alloys and metal oxides in making an electrode comprising:
   a) providing a substrate having an electrically insulating native oxide layer on a surface thereof, said substrate being selected from the group consisting of Group IVA, Group VA and Group VIA metals, aluminum, manganese, nickel, copper and stainless steel;
   b) depositing on said native oxide layer a metal selected from the group consisting of Group IA and Group VIIIA metals;
   c) directing a high energy beam onto said deposited metal and said native oxide layer to intermix the deposited metal with the native oxide;
   d) controlling the depth of intermixing of the deposited metal with the native oxide so as not to affect the bulk structure of said substrate;
   e) whereby said native oxide layer is changed from being electrically insulating to being more electrically conductive; and
   f) applying electrode material onto the native oxide layer so that the substrate is usable as an electrode.

2. A method according to claim 1, wherein said step of depositing is carried out by a deposition process selected from the group consisting of ion beam assisted deposition, electron beam deposition, chemical vapor deposition, physical vapor deposition, plasma assisted deposition, low pressure plasma deposition and plasma spray deposition.

3. A method according to claim 1, wherein said high energy beam comprises an ion beam.

4. A method according to claim 3, wherein said ion beam is directed along said deposited metal and said native oxide layer in a raster-like pattern.

5. A method according to claim 1, wherein said high energy beam comprises a laser beam.

6. A method according to claim 5, wherein said laser beam is directed along said deposited metal and said native oxide layer in a raster-like pattern.

7. A method according to claim 1, including sequentially depositing and intermixing until a predetermined mixing depth is obtained.

8. A method according to claim 1, wherein said electrode material is capacitor electrode material.

9. A method of improving electrical conductivity of metals, metal alloys and metal oxides in making an electrode comprising:
   a) providing a substrate having an electrically insulating native oxide layer on a surface thereof, said substrate being of a material operative for use as an electrode in a capacitor;
   b) depositing on said native oxide layer a metal selected from the group consisting of Group IA and Group VIIIA metals;
   c) directing a high energy beam onto said deposited metal and said native oxide layer to intermix the deposited metal with the native oxide;
   d) controlling the depth of intermixing of the deposited metal with the native oxide so as not to affect the bulk structure of said substrate;
   e) whereby said native oxide layer is changed from being electrically insulating to being more electrically conductive; and
   f) applying electrode material onto the native oxide layer so that the substrate is usable as an electrode.

10. A method according to claim 9, wherein said step of depositing is carried out by a deposition process selected from the group consisting of ion beam assisted deposition, electron beam deposition, chemical vapor deposition, physical vapor deposition, plasma assisted deposition, low pressure plasma deposition and plasma spray deposition.

11. A method according to claim 9, wherein said high energy beam comprises an ion beam.

12. A method according to claim 9, wherein said high energy beam comprises a laser beam.

* * * * *